United States Patent
Hofmann et al.

(10) Patent No.: US 6,977,413 B2
(45) Date of Patent: Dec. 20, 2005

(54) BAR-TYPE FIELD EFFECT TRANSISTOR AND METHOD FOR THE PRODUCTION THEREOF

(75) Inventors: Franz Hofmann, Munich (DE); Wolfgang Rosner, Ottobrunn (DE); Richard Johannes Luyken, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/220,344

(22) PCT Filed: Mar. 8, 2001

(86) PCT No.: PCT/DE01/00878

§ 371 (c)(1),
(2), (4) Date: Oct. 24, 2002

(87) PCT Pub. No.: WO01/69686

PCT Pub. Date: Sep. 20, 2001

(65) Prior Publication Data

US 2004/0016966 A1 Jan. 29, 2004

(30) Foreign Application Priority Data

Mar. 13, 2000 (DE) .......................................... 100 12 112

(51) Int. Cl.[7] .............................................. H01L 29/76
(52) U.S. Cl. ...................... 257/327; 257/328; 257/329; 257/350; 257/347; 257/348; 257/349
(58) Field of Search ................................ 257/327, 328, 257/329, 347–354, 401, 369, 330, 331, 507, 900, 334, 333, 303, 306

(56) References Cited

U.S. PATENT DOCUMENTS

| 4,996,574 A | | 2/1991 | Shirasaki | |
|---|---|---|---|---|
| 5,115,289 A | | 5/1992 | Hisamoto et al. | |
| 5,512,517 A | | 4/1996 | Bryant | |
| 5,637,884 A | | 6/1997 | Yang | |
| 5,801,397 A | | 9/1998 | Cunningham | |
| 6,432,829 B2 | * | 8/2002 | Muller et al. | ............... 438/694 |
| 6,448,615 B1 | * | 9/2002 | Forbes et al. | ............... 257/369 |
| 2001/0002054 A1 | * | 5/2001 | Sunami et al. | ............. 257/300 |
| 2002/0102813 A1 | * | 8/2002 | Wu et al. | ................... 438/404 |

FOREIGN PATENT DOCUMENTS

| DE | 199 24 571 A1 | 11/2000 |
|---|---|---|
| EP | 0623 963 A1 | 11/1994 |
| JP | 2263473 | 10/1990 |

OTHER PUBLICATIONS

D. Hisamoto et al. A Fully Depleted Lean Channel Transistor (DELTA)—A novel vertical ultrathin SOI MOSFET, in IEEE Electron Device Letters, vol. 11, No. 1 pp. 36–38, 1990.

* cited by examiner

Primary Examiner—Minhloan Tran
Assistant Examiner—Tan Tran
(74) Attorney, Agent, or Firm—Altera Law Group, LLC; Jeffrey R. Stone

(57) ABSTRACT

The bar-type field effect transistor consists of a substrate, a bar placed above a substrate and a gate and spacer placed above part of the bar.

10 Claims, 8 Drawing Sheets

BAR-TYPE FIELD EFFECT TRANSISTOR AND METHOD FOR THE PRODUCTION THEREOF

DESCRIPTION

The invention relates to a fin field-effect transistor and a method for fabricating a fin field-effect transistor.

Such a fin field-effect transistor and a method for fabricating such a fin field-effect transistor are disclosed in [1].

The fin field-effect transistor 200 from [1] has a silicon substrate 201 and, on the latter, an oxide layer made of silicon oxide $SiO_2$ 202 (see FIG. 2).

A fin 203 made of silicon is provided on a part of the oxide layer 202. A gate 204 of the resulting fin field-effect transistor 200 is arranged above a part of the fin 203 and along the entire height of the part of the fin.

In the case of the fin field-effect transistor 200 disclosed in [1], the channel region (not illustrated) can be inverted by charge carriers with the aid of the gate 204 extending along the side walls 205 of the fin 203. The fin 203 forms a source region 206 and a drain region 207.

However, in the case of the fin field-effect transistor 200 disclosed in [1], there is no self-aligned spacer technology for the LDD implantation or HDD implantation in order that the fin 203, which is also referred to as mesa, is highly doped with doping atoms in the source region 206 and in the drain region 207.

This is due, in particular, to the fact that oxide spacers 208 are formed only along the side walls 205 of the fin 203. As a result of the oxide spacers 208 that are present, however, the implantation of the mesa 203 is prevented via the side walls 205, and, in addition to the source region 206 and the drain region 207, the channel region is implanted with doping atoms. The channel region is not protected by an oxide spacer. This leads to underdiffusion during implantation of the fin field-effect transistor 200 with doping atoms.

Moreover, it is often desirable to keep the source region 206 and the drain region 207 of the fin 203 freely accessible in order that the drain region 207 of the fin 203 can be exactly doped in a simple manner.

This is not possible, however, with the fin field-effect transistor 200 in accordance with [1] and the corresponding fabrication method described in [1].

In the context of the invention, a fin field-effect transistor should generally be understood to mean a field-effect transistor whose source and drain extend vertically, also in an uncovered manner, or above an insulator layer, for example an oxide layer, and which has a gate which extends partly above the vertically extending region, in particular above the channel region of the field-effect transistor, and along the side walls of the resulting vertical structure. The channel region extends along the vertical structure from source to drain.

Consequently, the invention is based on the problem of specifying a fin field-effect transistor in which underdiffusion in the channel region below the gate in the context of implanting the gate with doping atoms is avoided.

Furthermore, the invention is based on the problem of specifying methods for fabricating such a fin field-effect transistor.

The problems are solved by the fin field-effect transistor and also by the methods for fabricating the fin field-effect transistor having the features in accordance with the independent patent claims.

A fin field-effect transistor has a substrate, a fin above the substrate and a gate and a spacer above a part of the fin.

In a method for fabricating a fin field-effect transistor, a fin is formed on a substrate. A gate layer is formed above the substrate and above a part of the fin. An insulation layer is subsequently formed above the gate layer. The gate layer is partly removed below the insulation layer and a spacer is formed in the partly removed region.

In a further method for fabricating a fin field-effect transistor, a fin is formed above a substrate. A gate layer is formed above the substrate, along and above a part of the fin. An insulation layer is formed above the gate layer. Above the region which is not covered by the gate layer, a layer to be etched away is formed up to a height which lies above the fin and below the insulation layer. A spacer is formed above a part of the layer to be etched away and the layer to be etched away is essentially removed except for the part which lies directly below the spacer.

A fin field-effect transistor with a spacer produced in accordance with a self-aligned process is specified for the first time by the invention. In the case of the fin field-effect transistor according to the invention, the spacer is formed above a part of the fin, thereby avoiding underdiffusion during source and drain implantation with doping atoms.

Moreover, in the case of the fin field-effect transistor according to the invention, the source region and the drain region of the fin remain freely accessible, thereby enabling exact and simple doping of the source region and of the drain region of the fin.

Preferred developments of the invention emerge from the dependent claims.

The refinements described below refer both to the fin field-effect transistor and to the methods for fabricating the fin field-effect transistor.

The gate and/or the spacer may extend essentially along the entire height of the part of the fin.

The substrate may have silicon, and, as an alternative, it is also possible to provide on the substrate a further layer, for example made of silicon oxide, generally made of an oxide on which the fin and also the gate are arranged.

The fin may have silicon.

In accordance with one refinement of the invention, the gate has polysilicon. Furthermore, the gate may also be formed by a stack of polysilicon and tungsten silicide.

The spacer may have silicon oxide and/or silicon nitride.

In accordance with a further refinement of the invention, the spacer has a first spacer part with silicon oxide and a second spacer part with silicon nitride. The second spacer part is arranged above the first spacer part.

In accordance with a further refinement of the invention, an etching stop layer is provided between the substrate and the fin and the gate. The etching stop layer preferably has silicon nitride.

This refinement results in a further simplification of the method for fabricating the fin field-effect transistor since there is no need for active monitoring during the etching of the polysilicon layer—forming the gate—at the boundary with the substrate or the oxide. The etching process is automatically stopped at the etching stop layer in accordance with this refinement.

Furthermore, the height of the spacer with respect to the substrate may be essentially equal to the height of the gate.

Underdiffusion during the implantation of the source region and drain region of the fin field-effect transistor is practically completely avoided by virtue of this refinement.

At least some of the elements of the fin field-effect transistor may be formed by means of deposition.

Consequently, in accordance with this development, customary semiconductor process technology can be used, thereby enabling a simple and cost-effective realization of the fabrication methods.

The layer to be removed may be removed by means of etching, for example by means of dry etching or wet etching.

Exemplary embodiments of the invention are illustrated in the figures and are explained in more detail below.

In the figures:

FIG. 1 shows a fin field-effect transistor 100 in accordance with a first exemplary embodiment of the invention.

Figure 1:
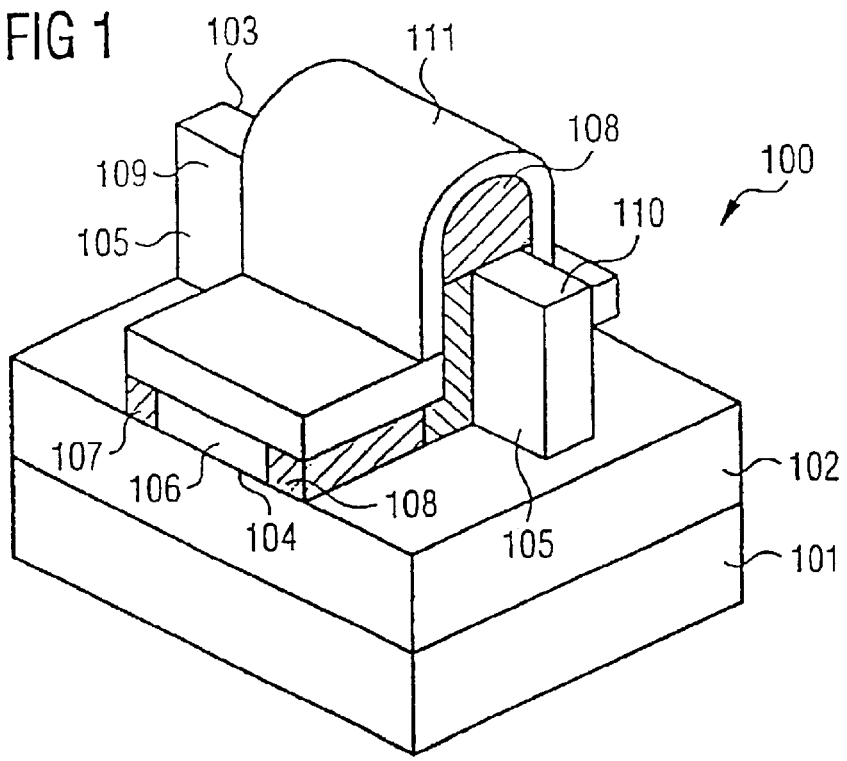
FIG. 1 shows a fin field-effect transistor in accordance with a first exemplary embodiment of the invention.
Figure 2:
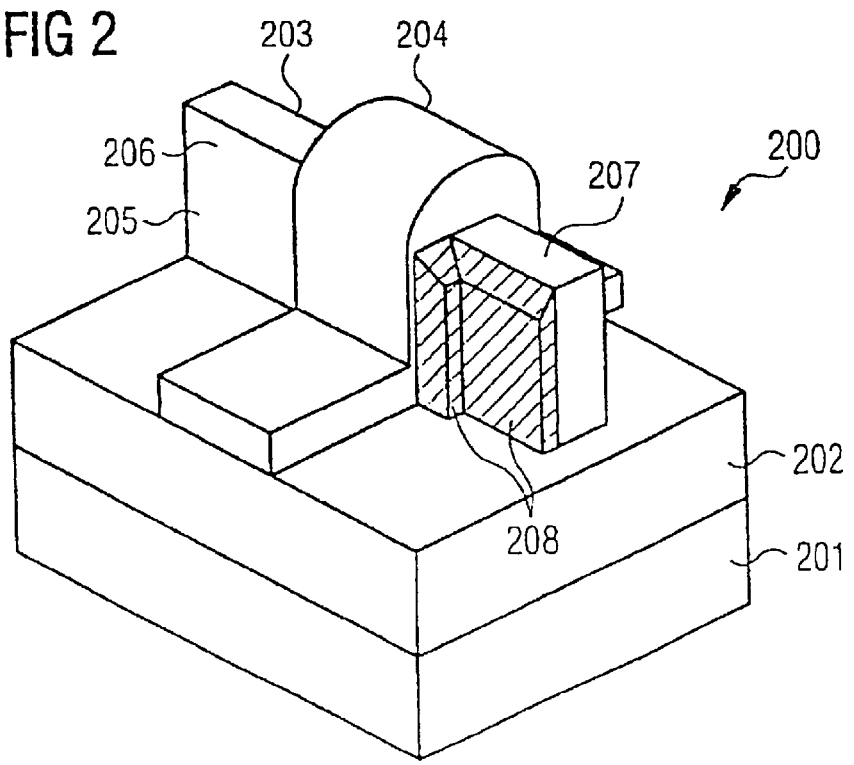
FIG. 2 shows a fin field-effect transistor in accordance with the prior art.

The fin field-effect transistor 100 has a substrate 101, on which an oxide layer 102 made of silicon oxide $SiO_2$ having a layer thickness of approximately 200 nm is deposited (cf. FIG. 1). A fin 103 made of silicon is formed on the oxide layer 102. In accordance with the exemplary embodiment, a method known from SOI technology (SOI: Silicon on Isolator) is used to fabricate the fin 103. A polysilicon layer 106 forming a gate 104 and also spacers 107, 108 made of silicon oxide are arranged above a partial region of the fin 103 and along the partial region in the vertical direction along the side walls 105 of the fin 103 and in the corresponding linearly continued region on the oxide layer 102.

A protective layer 111 made of silicon nitride $Si_3N_4$ for protecting the gate 104 is applied above the gate 104 and the spacers 107, 108. A source region 109 and a drain region 110 are thus formed, which can be conductively coupled to one another via a channel region (not illustrated) depending on the control by means of the gate 104.

Hereinafter the same reference symbols are used for identical elements in different drawings.

Figure 3:
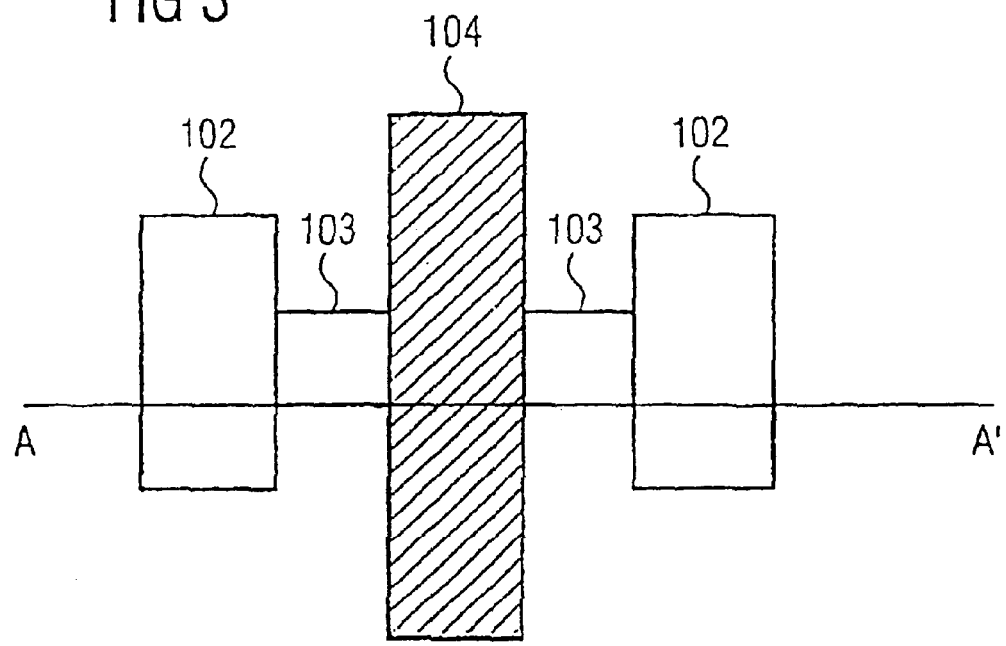
FIG. 3 shows a plan view of the fin field-effect transistor from FIG. 1 with a section line A-A'.

FIG. 3 shows the fin field-effect transistor 100 from FIG. 1 in plan view.

FIG. 3 illustrates a section line A-A', along which a section is taken which produces the sectional views of the fin field-effect transistor 100 from FIG. 1 which are illustrated in FIG. 4A to FIG. 4E.

The individual method steps for fabricating the fin field-effect transistor 100 in accordance with the first exemplary embodiment are explained below with reference to FIG. 4A to FIG. 4E.

Figure 4:
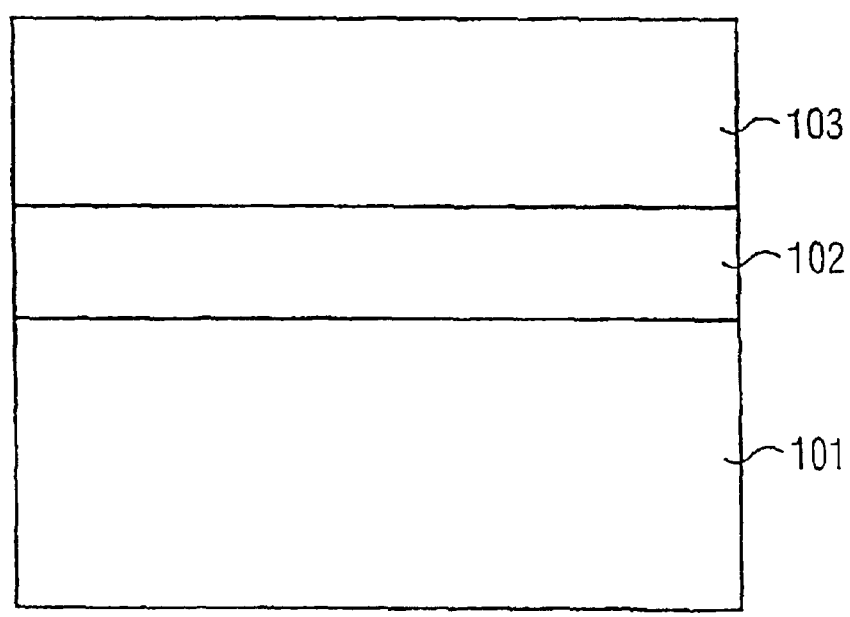
FIGS. 4A to 4E show sectional views of the fin field-effect transistor from FIG. 1 along the section line A-A' from FIG. 3, illustrating the individual method steps of the method for fabricating the fin field-effect transistor from FIG. 1 in accordance with a first exemplary embodiment of the invention.
Figure 4:
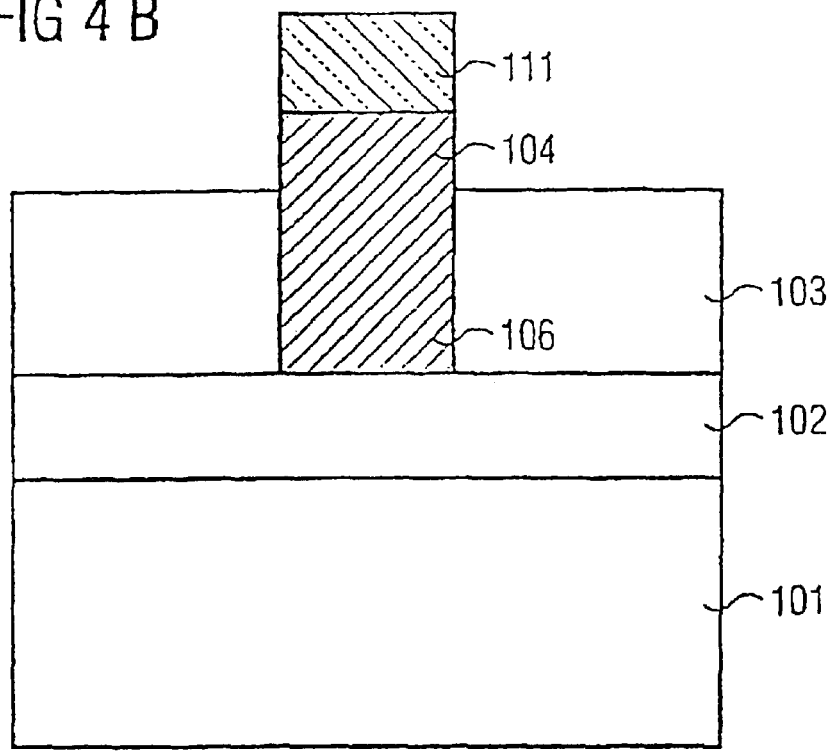
Figure 4:
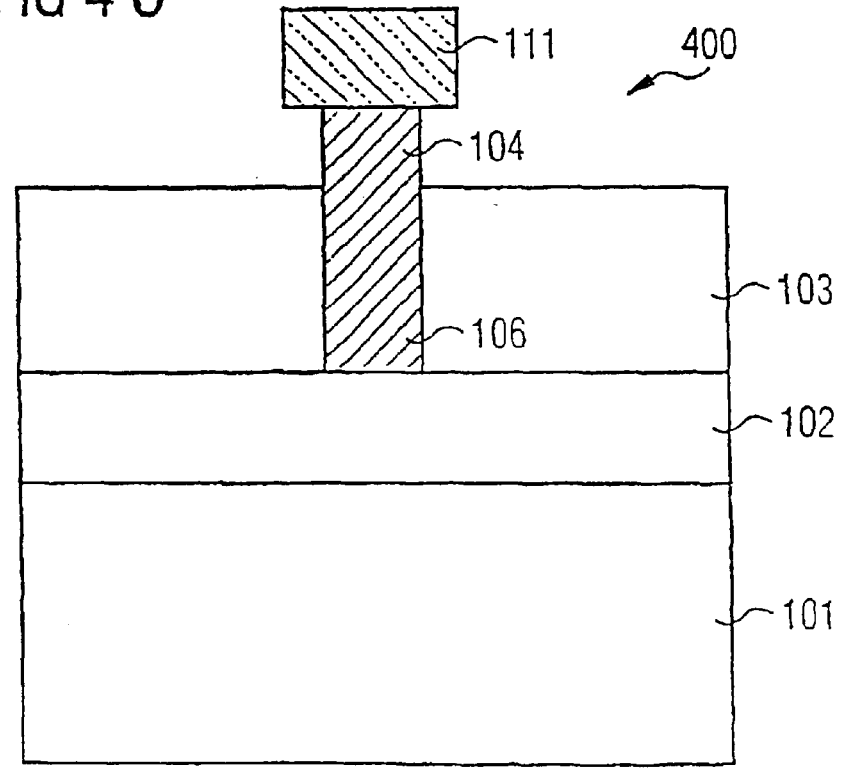
Figure 4:
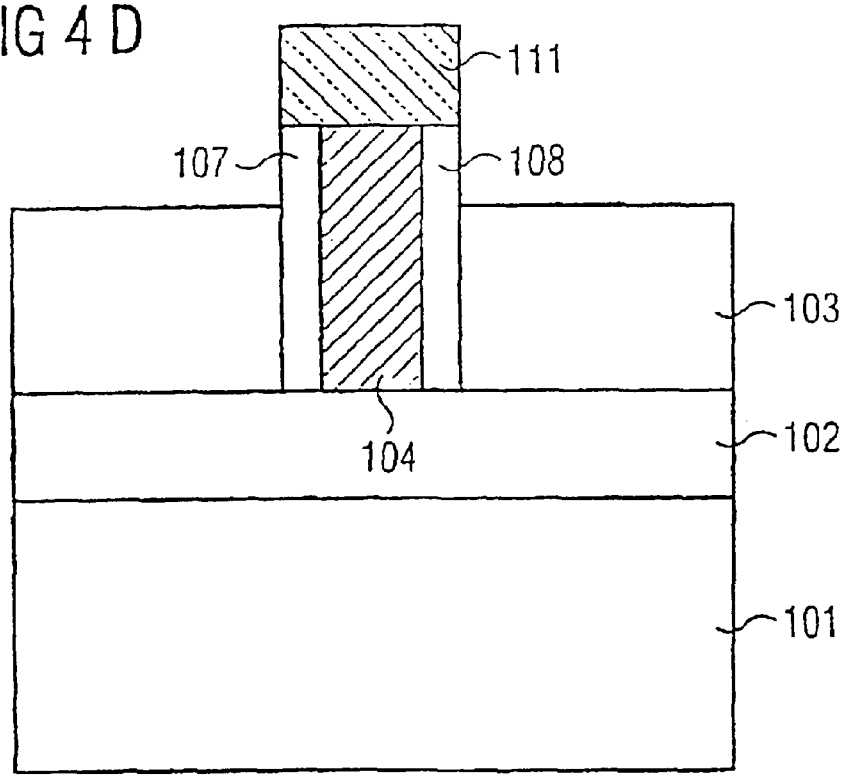
Figure 4:
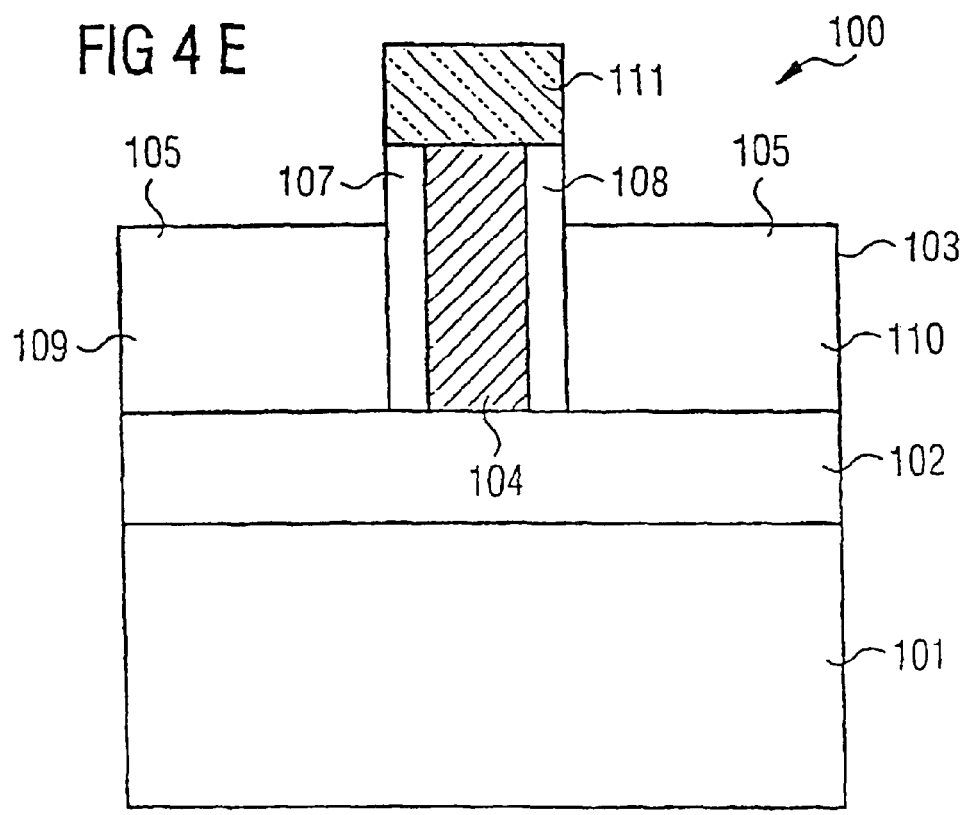

The starting point is an SOI wafer, i.e. clearly a silicon substrate 101 in which a silicon oxide layer 102 is situated (cf. FIG. 4A).

In a first step, the threshold voltage of the fin field-effect transistor 100 is set by the implantation of doping atoms, with boron atoms in accordance with the exemplary embodiment. In the case of a fully depleted transistor, it is also possible to omit this channel implantation in the context of the method.

In a further step, photoresist is applied to the silicon layer formed, in such a way that the photoresist indicates where the fin 103 is intended to be formed.

In a further step, the silicon which is not covered with photoresist is etched by means of a wet etching method or a dry etching method.

The etching method is stopped as soon as the surface of the silicon oxide layer 102 is reached.

In a further step, the photoresist is removed from the fin 103 now produced.

In a further step, gate oxide is formed along the side walls of the fin 103 and also above the fin 103.

In a further step, a layer of polysilicon is deposited above the silicon oxide layer 102, along the side walls of the fin 103 and also above the fin 103, by means of a CVD method. During the deposition of the polysilicon, the resulting polysilicon layer is doped with phosphorus atoms or boron atoms.

In a further step, a silicon nitride layer ($Si_3N_4$) is deposited, by means of a CVD method, as a protective layer 111 on the polysilicon layer which serves as gate 104 in the fin field-effect transistor 100.

Photoresist is subsequently applied on the silicon nitride layer 107 in such a way that, by virtue of the photoresist, the region which is later intended to be used as gate 104 and spacers 105, 106 is not etched in further etching steps.

In a subsequent step, the silicon nitride layer 111, which is not covered with photoresist, is etched by means of a wet etching method or a dry etching method.

Furthermore, the polysilicon layer 106, which is not protected by the photoresist is etched away by means of a dry etching method or a wet etching method.

The etching method is ended at the surface of the silicon oxide layer 102, so that oxide is not etched.

The photoresist is subsequently removed from the silicon nitride layer 111 (cf. FIG. 4B).

In a further step (cf. FIG. 4C), the polysilicon layer 160 is partly etched away below the silicon nitride layer 111 by means of wet etching or dry etching. Consequently, a T-shaped structure 400 is clearly produced.

In a further step (cf. FIG. 4D), a silicon oxide layer having a thickness of approximately 500 nm is deposited by means of a CVD method.

The silicon oxide layer is subsequently removed again by means of a chemical mechanical polishing method until the silicon nitride layer 111 is reached. Once the silicon nitride layer 111 has been reached, the CMP method is stopped.

Silicon oxide is subsequently etched as far as the surface of the silicon oxide layer 102 by means of a dry etching method. The dry etching is selective with respect to silicon nitride.

The desired spacers 105, 106 of the fin field-effect transistor 100 which are illustrated in FIG. 1 are thus formed below the silicon nitride layer but above the fin 103 and on the side walls of the fin and on the silicon oxide layer 102 (cf. FIG. 4D).

In a further step (cf. FIG. 4E), screen oxide is deposited and the source region and the drain region of the fin 104 are n+-implanted via the side walls of the fin 103, which are now uncovered.

Moreover, implantation of atoms into the channel region is now not possible since the entire gate 104 is completely protected by the spacers 105, 106.

In concluding standard semiconductor process steps, contacts for gate, source and drain can be etched for the fin field-effect transistor 100, and siliciding of the fin field-effect transistor 100 is possible.

Figure 5:
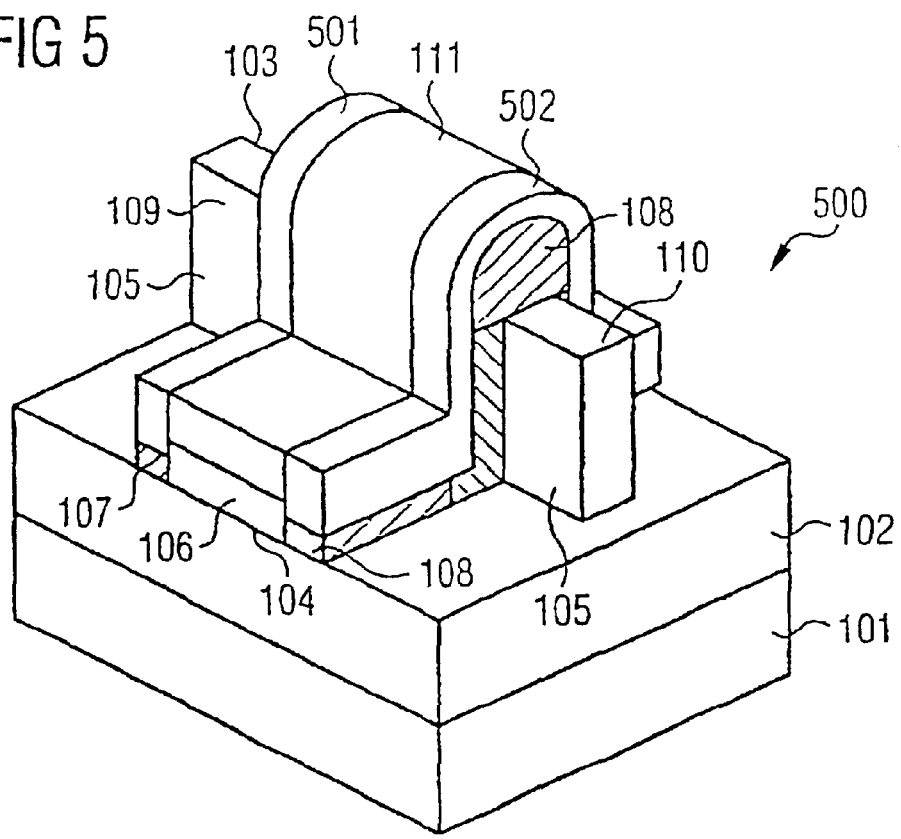
FIG. 5 shows a fin field-effect transistor in accordance with a second exemplary embodiment of the invention.

FIG. 5 shows a fin field-effect transistor 500 in accordance with a second exemplary embodiment of the invention.

In the case of the fin field-effect transistor 500, it is no longer necessary to undercut the polysilicon layer 106 in order to fabricate said transistor, as is explained below.

Consequently, the fin field-effect transistor 500 in accordance with the second exemplary embodiment is particularly suitable for semiconductor standard processes.

The fin field-effect transistor 500 in accordance with the second exemplary embodiment differs from the fin field-effect transistor 100 in accordance with the first exemplary embodiment essentially by the fact that the silicon nitride layer 107 essentially lies only above the polysilicon layer of the gate 104, and that two silicon nitride spacers 501, 502 are arranged above the spacers 107, 108.

Figure 6:
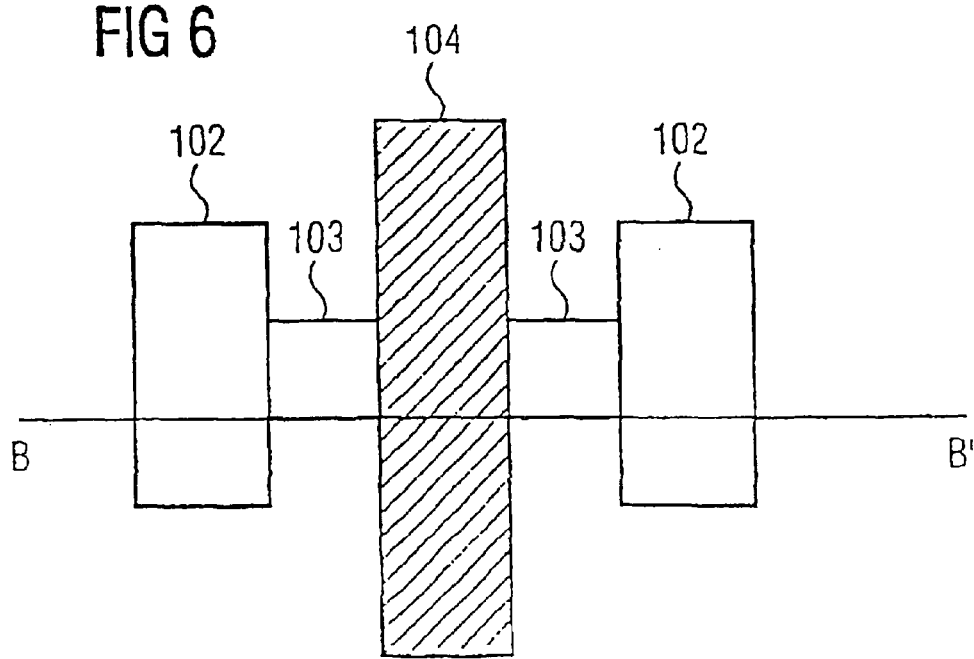
FIG. 6 shows a plan view of the fin field-effect transistor from FIG. 5 with a section line B-B'.

FIG. 6 shows the fin field-effect transistor 500 from FIG. 5 in plan view with the section line B-B', along which the sectional views of FIG. 7A to FIG. 7E of the fin field-effect transistor 500 are produced.

Figure 7:
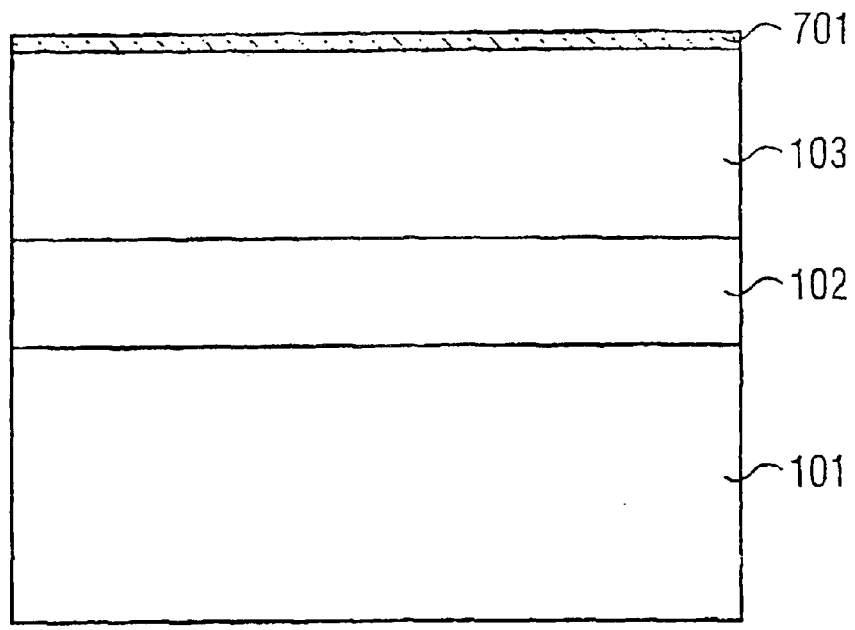
FIGS. 7A to 7E show sectional views of the fin field-effect transistor from FIG. 5 along the section line B-B' from FIG. 6, illustrating the individual method steps of the method for fabricating the fin field-effect transistor from FIG. 6 in accordance with a second exemplary embodiment of the invention.
Figure 7:
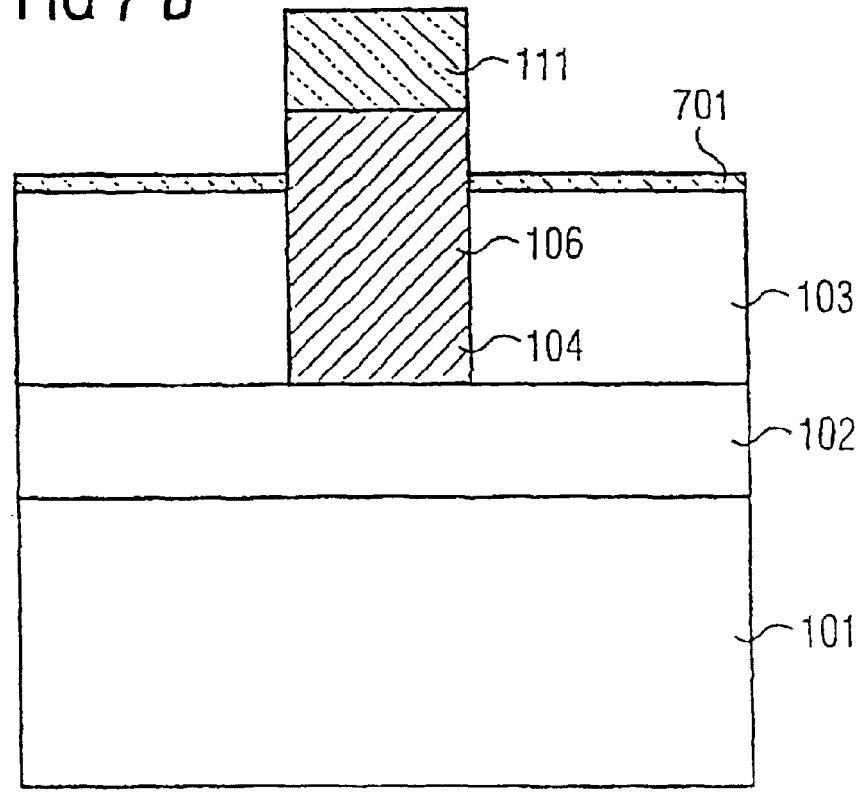

FIG. 7A shows the fin field-effect transistor 500 in accordance with the second exemplary embodiment in the sectional view along the section line B-B' from FIG. 6 with the substrate 101, the silicon oxide layer 102 and the fin 103 and also a silicon nitride layer 701 on the fin 103.

It is optionally possible, in a further step, to carry out a charge carrier implantation for the purpose of setting the threshold voltage of the fin field-effect transistor 500.

In a further step, gate oxide is formed above the fin and the silicon nitride layer 701.

In a further step (cf. FIG. 7B), a polysilicon layer is deposited by means of a suitable CVD method, the polysilicon layer 106 being doped with phosphorus atoms or boron atoms during the deposition process. The polysilicon layer 106 has a thickness of approximately 400 nm.

In this connection, it should be noted that the thickness of the polysilicon layer 106 does not constitute a critical criterion in the context of the fabrication methods.

After the polysilicon has been removed by means of a chemical mechanical polishing method to such an extent as to produce the height of a structure which finally forms the gate 104 of the fin field-effect transistor 100, a silicon nitride layer 111 as a protective layer is deposited on the polysilicon layer 106 by means of a CVD method (cf. FIG. 7B).

Afterwards, photoresist is applied to the region provided for the gate 104 of the fin field-effect transistor 500, and that part of the silicon nitride layer 702 which is not covered with the photoresist is etched away by means of a dry etching method or a wet etching method.

The regions of the polysilicon layer 106 which are not protected by the photoresist are also etched away by means of a dry etching method or a wet etching method. This etching is selective with respect to silicon nitride.

The etching method is stopped at the surface of the silicon nitride layer 701.

The photoresist is subsequently removed again from the silicon nitride layer 111 (cf. FIG. 7B).

In a further step, a silicon oxide layer 702 having a thickness of approximately 500 nm is deposited, by means of a suitable CVD method, above the fin 103, on the silicon nitride layer 701 of the fin 103 and also above the remaining surface regions of the fin field-effect transistor 500 which were uncovered until then.

The silicon oxide is removed by means of a chemical mechanical polishing method, the CMP method being stopped at the upper boundary of the silicon nitride layer 111 arranged on the polysilicon layer 106.

Figure 7C:
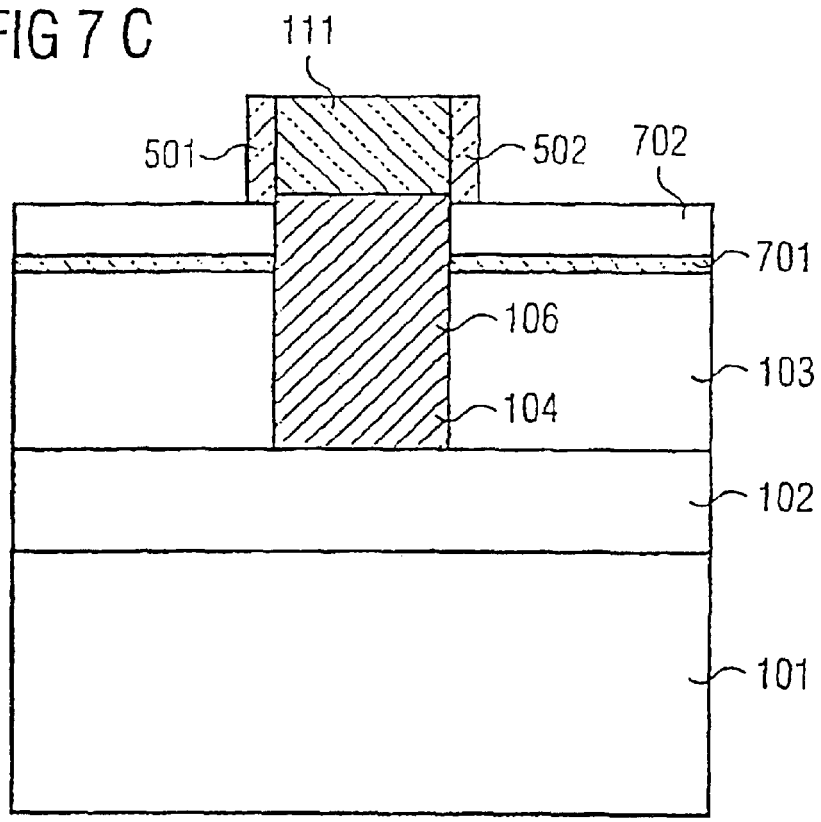

Afterwards, the silicon oxide layer 702 is etched anisotropically as far as the lower edge of the silicon nitride layer 111 situated on the polysilicon layer 106 (cf. FIG. 7C).

Afterwards, a silicon nitride layer having a thickness of 50 nm in accordance with the exemplary embodiment, where it should be noted that the thickness of the silicon nitride layer can be predetermined in a highly variable manner, is deposited by means of a suitable CVD method.

In a further step, the silicon nitride spacers 501, 502 (cf. FIG. 7C) are etched by means of a dry etching method.

Figure 7D:
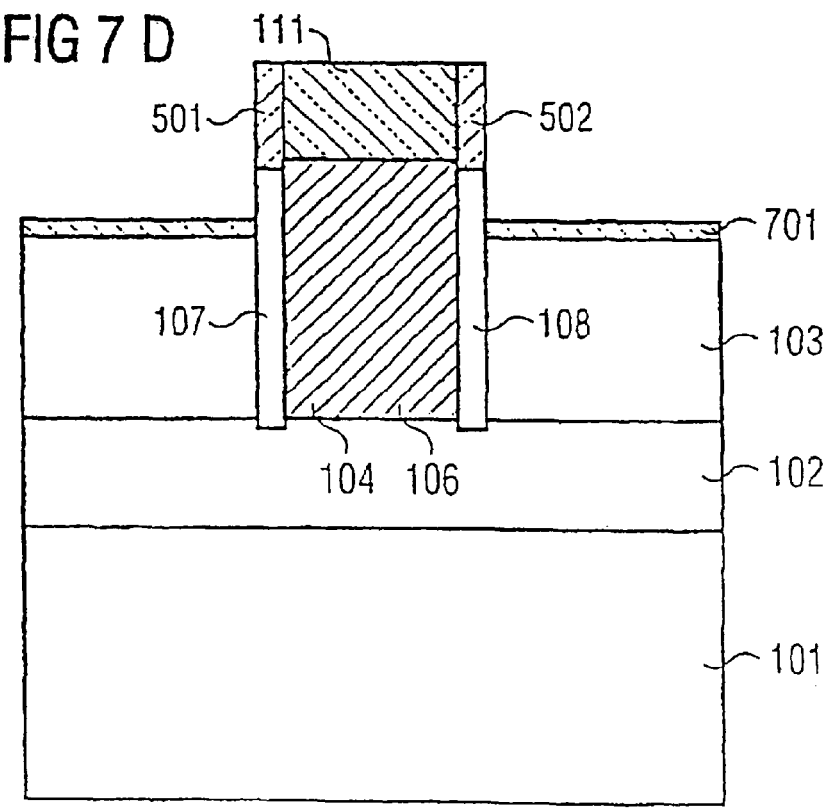
Figure 7E:
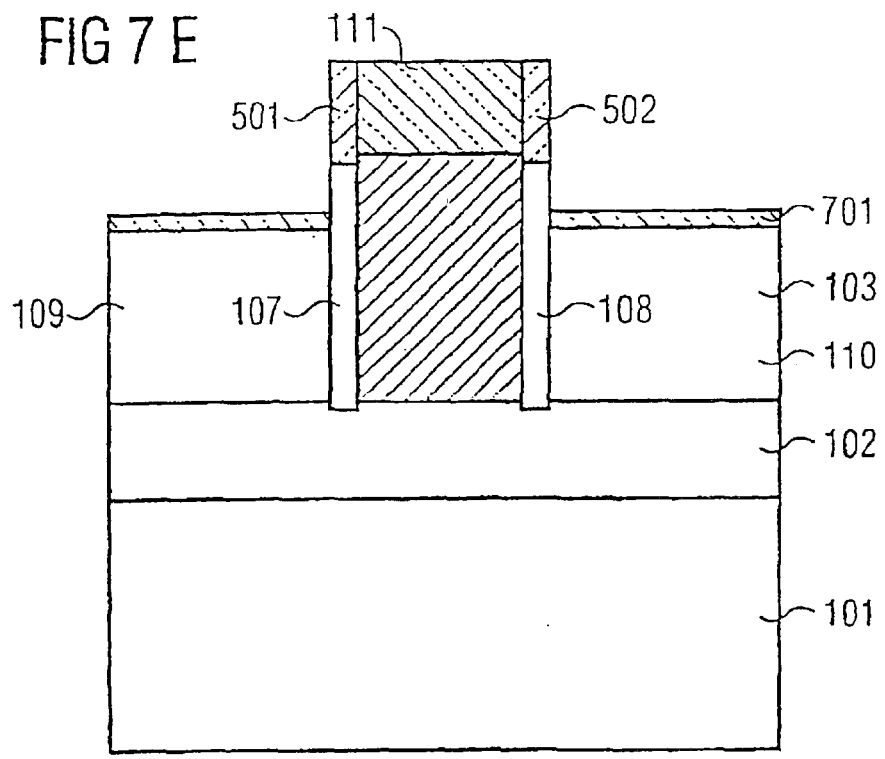

In a final step, the silicon oxide layer 702 on the silicon nitride layer 701 is etched away by means of a dry etching method, as a result of which silicon oxide spacers 107, 108 are formed (cf. FIG. 7D).

In a further step (cf. FIG. 7E), screen oxide is deposited and the source region and the drain region of the fin 104 are n+-implanted via the side walls of the fin 103, which are now uncovered.

The result is the fin field-effect transistor 500, in which, once again in further method steps, the contacts to source, gate and drain can be etched or which can be subjected to a customary semiconductor standard process for further treatment. Siliciding of the fin field-effect transistor 500 in accordance with the second exemplary embodiment is also possible.

Figure 8:
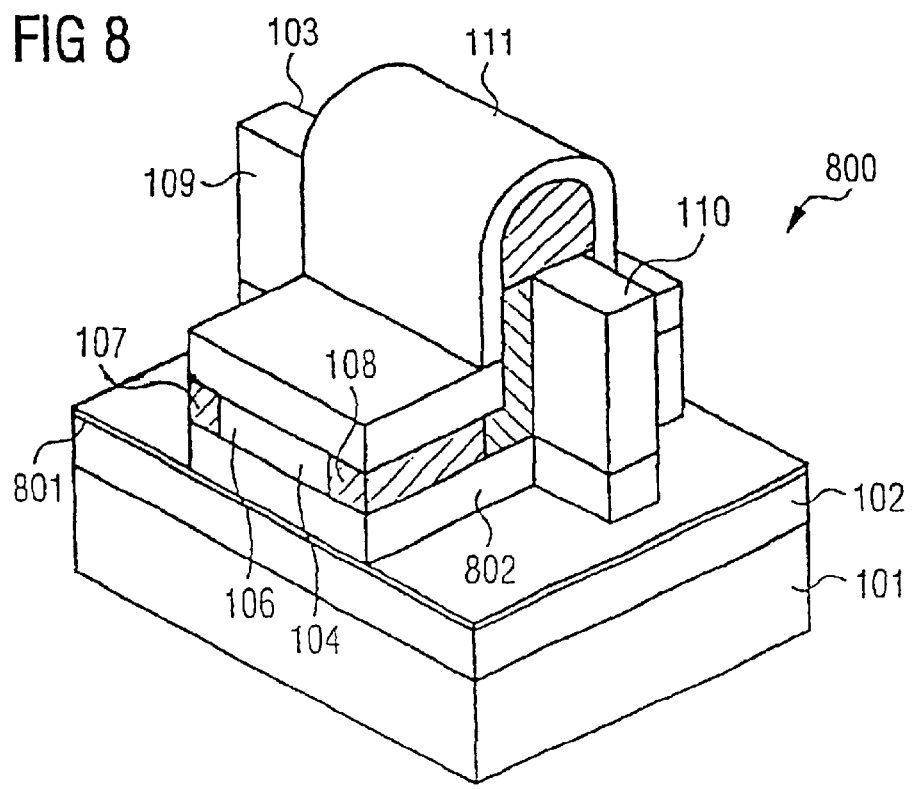
FIG. 8 shows a fin field-effect transistor in accordance with a third exemplary embodiment of the invention.

FIG. 8 shows a fin field-effect transistor 800 in accordance with a third exemplary embodiment.

The fin field-effect transistor 800 in accordance with the third exemplary embodiment essentially corresponds to the fin field-effect transistor 100 in accordance with the first exemplary embodiment, with the difference that a silicon nitride layer 801 is provided as an etching stop layer on the silicon oxide layer 102. Furthermore, a further silicon oxide layer 802 is provided on the silicon nitride layer 801.

The etching stop layer 801 obviates the need for "etching to time" of the last etching method step in each case as far as the surface of the silicon oxide layer 102, since each etching process is automatically stopped at the etching stop layer 801.

As an alternative, polysilicon can be used for an etching stop layer 801, as also constitutes the silicon nitride layer 702 in accordance with the second exemplary embodiment above the silicon oxide layer 102.

The fabrication process for the fin field-effect transistor 800 in accordance with the third exemplary embodiment likewise essentially corresponds to the fabrication process for the fin field-effect transistor 100 in accordance with the first exemplary embodiment, although the further silicon oxide layer 802 is deposited on the silicon nitride layer 801 by means of a CVD method. After corresponding preparation of the polysilicon layer with photoresist, the further silicon oxide layer 802 is etched anisotropically by means of a dry etching method or a wet etching method. The etching is ended on the silicon nitride layer 801.

It should be pointed out that another exemplary embodiment makes provision for providing the fin field-effect transistor 500 in accordance with the second exemplary embodiment without the etching stop layer 701, in which case the respective etching methods have to be stopped "manually" at the surface of the silicon oxide layer 102.

Furthermore, it should be noted that, instead of the CVD methods, it is also possible to use sputtering methods or vapor deposition methods, in each case also in combination with one another.

The following publication is cited in this document:

[1] D. Hisamoto et al, A Fully Depleted Lean-Channel Transistor (DELTA)—A novel vertical ultrathin SOI MOSFET, IEEE Electron Device Letters, Volume 11, No. 1, pp. 36–38, 1990

What is claimed is:

1. A fin field-effect transistor, comprising:
    a substrate;
    a fin above the substrate, the fin comprising a source region, a channel region and a drain region;
    a gate oxide formed along side walls of the fin and above the fin; and
    a gate and a spacer above the channel region of the fin, wherein the spacer is formed on side walls of the gate and separately from the gate oxide, wherein the side walls of the fin in the source region and in the drain region are uncovered from the spacer for implantation of the source region and the drain region of the fin with doping atoms.

2. The fin field-effect transistor as claimed in claim 1, in which the gate and the spacer extend essentially along the entire height of the part of the fin.

3. The fin field-effect transistor as claimed in claim 1, in which the substrate has a layer of silicon oxide provided above the substrate.

4. The fin field-effect transistor as claimed in claim 1, in which the fin has silicon.

5. The fin field-effect transistor as claimed in claim 1, in which the gate has polysilicon.

6. The fin field-effect transistor as claimed in claim 1, in which the spacer comprises silicon oxide and/or silicon nitride.

7. The fin field-effect transistor as claimed in claim 1, in which the spacer has a first spacer part with silicon oxide and a second spacer part with silicon nitride, the second spacer part being arranged above the first spacer part.

8. The fin field-effect transistor as claimed in claim 1, in which an etching stop layer is provided between the substrate and the fin and the gate.

9. The fin field-effect transistor as claimed in claim 8, in which the etching stop layer has silicon nitride.

10. The fin field-effect transistor as claimed in claim 1, in which the height of the spacer with respect to the substrate is essentially equal to the height of the gate.

* * * * *

UNITED STATES PATENT AND TRADEMARK OFFICE
CERTIFICATE OF CORRECTION

| | | |
|---|---|---|
| PATENT NO. | : 6,977,413 B2 | Page 1 of 1 |
| APPLICATION NO. | : 10/220344 | |
| DATED | : December 20, 2005 | |
| INVENTOR(S) | : Hoffman et al. | |

It is certified that error appears in the above-identified patent and that said Letters Patent is hereby corrected as shown below:

On the front page of the patent under the listing (30) Foreign Application Priority Data, delete "100 12 112" and add --100 12 112.8--;

Column 4, line 46, delete after the words "polysilicon layer" the number listed as "160" and add --106--.

Signed and Sealed this

Twenty-fourth Day of April, 2007

JON W. DUDAS
*Director of the United States Patent and Trademark Office*